United States Patent
Kang et al.

(10) Patent No.: US 10,770,021 B2
(45) Date of Patent: Sep. 8, 2020

(54) DISPLAY DEVICE AND DRIVING METHOD OF THE SAME

(71) Applicant: LG Display Co., Ltd., Seoul (KR)

(72) Inventors: YooJin Kang, Seoul (KR); SungJin Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 174 days.

(21) Appl. No.: 15/991,258

(22) Filed: May 29, 2018

(65) Prior Publication Data

US 2018/0342222 A1    Nov. 29, 2018

(30) Foreign Application Priority Data

May 29, 2017 (KR) .................. 10-2017-0066012

(51) Int. Cl.
*G09G 3/36* (2006.01)
*G09G 3/3275* (2016.01)
(Continued)

(52) U.S. Cl.
CPC ......... *G09G 3/3688* (2013.01); *G02F 1/1368* (2013.01); *G09G 3/003* (2013.01);
(Continued)

(58) Field of Classification Search
CPC .... G09G 3/3688; G09G 3/003; G09G 3/3275; G09G 3/3611; G09G 5/14;
(Continued)

(56) References Cited

U.S. PATENT DOCUMENTS

2002/0101396 A1* 8/2002 Huston .................. G09G 3/002
345/87
2003/0112507 A1* 6/2003 Divelbiss ............. H04N 13/363
359/464
(Continued)

FOREIGN PATENT DOCUMENTS

CN    1734805 A    2/2006
CN    101656890 A    2/2010
(Continued)

*Primary Examiner* — Wing H Chow
(74) *Attorney, Agent, or Firm* — Seed Intellectual Property Law Group LLP

(57) ABSTRACT

The present disclosure relates to a display device and a driving method of a display device. The display device includes a display panel including a first display area and a second display area; a data correcting unit which is applied with n-bit input image data to generate (n-a)-bit corrected image data; a timing control unit which is applied with the (n-a)-bit corrected image data to generate (n-a)-bit output image data; and a data driving unit which is applied with the (n-a)-bit output image data to output a first data voltage to a first pixel disposed in the first display area and output a second data voltage to a second pixel which is disposed in the second display area and corresponds to the first pixel. Therefore, corrected image data which has a lower bit number than that of input image data is used to express the same color depth as a color depth which is expressed by the input image data so that the size of the data is reduced and the data amount processed by the timing control unit and the data driver is reduced. Therefore, the processing speed of the timing control unit and the data driver may be improved.

16 Claims, 14 Drawing Sheets

| F | 1 (1st Frame) | | 2 (2st Frame) | | 3 (3st Frame) | | 4 (4st Frame) | | 5 (5st Frame) | | 6 (6st Frame) | | 7 (7st Frame) | | 8 (8st Frame) | | ARD |
|---|---|---|---|---|---|---|---|---|---|---|---|---|---|---|---|---|---|
| LS<br>LBD<br>(3bit) | Low (Left eye) | High (Right eye) | Low (Left eye) | High (Right eye) | Low (Left eye) | High (Right eye) | Low (Left eye) | High (Right eye) | Low (Left eye) | High (Right eye) | Low (Left eye) | High (Right eye) | Low (Left eye) | High (Right eye) | Low (Left eye) | High (Right eye) | |
| 000 (0) | n | n | n | n | n | n | n | n | n | n | n | n | n | n | n | n | n |
| 001 (1) | n | n+1 | n | n+1 | n | n | n | n | n | n | n | n | n | n | n | n | n+0.125 |
| 010 (2) | n | n+1 | n | n | n | n | n | n+1 | n | n | n | n | n | n+1 | n | n+1 | n+0.25 |
| 011 (3) | n | n+1 | n | n+1 | n | n+1 | n | n+1 | n | n | n | n | n | n+1 | n | n+1 | n+0.375 |
| 100 (4) | n | n+1 | n | n+1 | n | n+1 | n | n+1 | n | n+1 | n | n+1 | n | n+1 | n | n+1 | n+0.5 |
| 101 (5) | n | n+1 | n | n+1 | n | n+1 | n+1 | n+1 | n+1 | n+1 | n | n+1 | n | n+1 | n | n+1 | n+0.625 |
| 110 (6) | n | n+1 | n | n+1 | n+1 | n+1 | n+1 | n+1 | n | n+1 | n | n+1 | n+1 | n+1 | n+1 | n+1 | n+0.75 |
| 111 (7) | n | n+1 | n | n+1 | n+1 | n+1 | n+1 | n+1 | n+1 | n+1 | n+1 | n+1 | n+1 | n+1 | n+1 | n+1 | n+0.875 |

(51) Int. Cl.
  *G02F 1/1368* (2006.01)
  *H01L 27/12* (2006.01)
  *G09G 5/14* (2006.01)
  *G09G 3/00* (2006.01)

(52) U.S. Cl.
  CPC ......... *G09G 3/3275* (2013.01); *G09G 3/3611* (2013.01); *G09G 5/14* (2013.01); *H01L 27/124* (2013.01); *G09G 2310/027* (2013.01); *G09G 2310/0275* (2013.01); *G09G 2320/0271* (2013.01); *G09G 2320/0285* (2013.01); *G09G 2360/16* (2013.01)

(58) Field of Classification Search
  CPC ..... G09G 2310/027; G09G 2310/0275; G09G 2320/0271; G09G 2320/0285; G09G 2360/16; G02F 1/1368; H01L 27/124
  See application file for complete search history.

(56) References Cited

U.S. PATENT DOCUMENTS

| | | |
|---|---|---|
| 2006/0033445 A1 | 2/2006 | Kim et al. |
| 2010/0007597 A1 | 1/2010 | Lee et al. |
| 2010/0045780 A1* | 2/2010 | Kwon .................. H04N 13/161 348/51 |
| 2013/0050286 A1 | 2/2013 | Yoshinaga et al. |
| 2017/0132972 A1 | 5/2017 | Tsuchida |

FOREIGN PATENT DOCUMENTS

| | | |
|---|---|---|
| CN | 102270435 A | 12/2011 |
| KR | 10-2006-0088391 A | 8/2006 |

\* cited by examiner

| ID (10bit) | HBD (8bit) | LBD (2bit) |
|---|---|---|
| 0000111110 (62gray) | 00001111 (15gray) | 10 (2) |
| 0000111111 (63gray) | 00001111 (15gray) | 11 (3) |
| 0001000000 (64gray) | 00010000 (16gray) | 00 (0) |
| 0001000001 (65gray) | 00010000 (16gray) | 01 (1) |
| 0001000010 (66gray) | 00010000 (16gray) | 10 (2) |
| 0001000011 (67gray) | 00010000 (16gray) | 11 (3) |
| 0001000100 (68gray) | 00010001 (17gray) | 00 (0) |
| 0001000101 (69gray) | 00010001 (17gray) | 01 (1) |

| F<br>LBD (2bit) \ LS | 1 (1st Frame) | | 2 (2st Frame) | | 3 (3st Frame) | | 4 (4st Frame) | | ARD |
|---|---|---|---|---|---|---|---|---|---|
| | Low (Left eye) | High (Right eye) | Low (Left eye) | High (Right eye) | Low (Left eye) | High (Right eye) | Low (Left eye) | High (Right eye) | |
| 00 (0) | n | n | n | n | n | n | n | n | n |
| 01 (1) | n | n+1 | n | n+1 | n | n | n | n | n+0.25 |
| 10 (2) | n | n+1 | n | n+1 | n | n+1 | n | n+1 | n+0.5 |
| 11 (3) | n | n+1 | n | n+1 | n+1 | n+1 | n+1 | n+1 | n+0.75 |

FIG. 7

| ID (10bit) | HBD (7bit) | LBD (3bit) |
|---|---|---|
| 0000111110 (62gray) | 0000111 (7gray) | 110 (6) |
| 0000111111 (63gray) | 0000111 (7gray) | 111 (7) |
| 0001000000 (64gray) | 0001000 (8gray) | 000 (0) |
| 0001000001 (65gray) | 0001000 (8gray) | 001 (1) |
| 0001000010 (66gray) | 0001000 (8gray) | 010 (2) |
| 0001000011 (67gray) | 0001000 (8gray) | 011 (3) |
| 0001000100 (68gray) | 0001000 (8gray) | 100 (4) |
| 0001000101 (69gray) | 0001000 (8gray) | 101 (5) |
| 0001000110 (70gray) | 0001000 (8gray) | 110 (6) |
| 0001000111 (71gray) | 0001000 (8gray) | 111 (7) |
| 0001001000 (72gray) | 0001001 (9gray) | 000 (0) |
| 0001001001 (73gray) | 0001001 (9gray) | 001 (1) |

| F | 1 (1st Frame) | | 2 (2st Frame) | | 3 (3st Frame) | | 4 (4st Frame) | | 5 (5st Frame) | | 6 (6st Frame) | | 7 (7st Frame) | | 8 (8st Frame) | | ARD |
|---|---|---|---|---|---|---|---|---|---|---|---|---|---|---|---|---|---|
| LBD (3bit) | Low (Left eye) | High (Right eye) | Low (Left eye) | High (Right eye) | Low (Left eye) | High (Right eye) | Low (Left eye) | High (Right eye) | Low (Left eye) | High (Right eye) | Low (Left eye) | High (Right eye) | Low (Left eye) | High (Right eye) | Low (Left eye) | High (Right eye) | |
| 000 (0) | n | n | n | n | n | n | n | n | n | n | n | n | n | n | n | n | n |
| 001 (1) | n | n+1 | n | n+1 | n | n | n | n | n | n | n | n | n | n | n | n | n+0.125 |
| 010 (2) | n | n+1 | n | n | n | n | n | n+1 | n | n | n | n | n | n+1 | n | n+1 | n+0.25 |
| 011 (3) | n | n+1 | n | n+1 | n | n+1 | n | n+1 | n | n | n | n | n | n+1 | n | n+1 | n+0.375 |
| 100 (4) | n | n+1 | n | n+1 | n | n+1 | n | n+1 | n+1 | n | n+1 | n | n+1 | n+1 | n | n+1 | n+0.5 |
| 101 (5) | n | n+1 | n | n+1 | n | n+1 | n+1 | n+1 | n | n+1 | n+1 | n+1 | n+1 | n+1 | n | n+1 | n+0.625 |
| 110 (6) | n | n+1 | n | n+1 | n+1 | n+1 | n+1 | n+1 | n+1 | n+1 | n+1 | n+1 | n+1 | n+1 | n+1 | n+1 | n+0.75 |
| 111 (7) | n | n+1 | n | n+1 | n+1 | n+1 | n+1 | n+1 | n+1 | n+1 | n+1 | n+1 | n+1 | n+1 | n+1 | n+1 | n+0.875 |

FIG. 9

DISPLAY DEVICE AND DRIVING METHOD OF THE SAME

CROSS-REFERENCE TO RELATED APPLICATION

This application claims the priority of Korean Patent Application No. 10-2017-0066012 filed on May 29, 2017, in the Korean Intellectual Property Office, the disclosure of which is incorporated herein by reference.

BACKGROUND

Technical Field

The present disclosure relates to a display device and a driving method of the same, and more particularly, to a display device which may reduce bits of image data while maintaining a color depth of a display panel and a driving method of the same.

Description of the Related Art

As the information society is developed, demands for display devices for displaying images are increased in various forms. Recently, various display devices such as a liquid crystal display device, a plasma display panel, and an organic light emitting display device are utilized.

The display devices include a display panel in which data lines and gate lines are formed and pixels are disposed at the intersections of the data lines and the gate lines. Further, the display devices include a data driver which supplies a data voltage to the data lines, a gate driver which supplies a gate voltage to the gate lines, and a timing control unit which controls the data driver and the gate driver.

Specifically, in order to display a space which is similar to an actual space, in recent years, a display panel which is divided into a left eye display area and a right eye display area and outputs images corresponding to virtual reality to the left eye display area and the right eye display area is being studied.

In a display device which implements virtual reality, the data driver receives image data of a predetermined bit from the timing control unit to convert the image data into a data voltage corresponding to an analog voltage and provide the converted data voltage to pixels disposed in the left eye display area and the right eye display area.

In this case, when bits of the image data are increased, a color depth expressed in the corresponding pixel is deepened, so that an image quality may be increased. In order to implement a high quality of color depth, that is, in order to implement a color depth having high bits, bits which can be processed by the data driver need to be as high as the bits corresponding to a desired color depth. For example, in order to implement a high quality of color depth having a gray scale of 1024, the bits which can be processed by the data driver need to be 10 bits. Therefore, in order to implement an excellent color depth, the size of internal components of the data driver is inevitably increased and thus the size of the data driver is undesirably increased.

Further, the data driver needs to receive the image data as many as the bits corresponding to a desired color depth from the timing control unit, so that the data transmission amount between the timing control unit and the data driver is also increased.

BRIEF SUMMARY

In one or more embodiments, the present disclosure provides a display device and a driving method of the same in which the bit number of image data for implementing the same color depth is reduced to increase a data processing speed.

In one or more embodiments, the present disclosure provides a display device and a driving method of the same in which even when a moving image screen with frequent gray scale change is displayed, the bit number of image data is reduced to increase a data processing speed.

In one or more embodiments, the present disclosure provides a display device and a driving method of the same in which the bit number of the image data is reduced to reduce the sizes of the timing control unit and the data driver which process the image data and the bezel size is also reduced.

Embodiments of the present disclosure are not limited to the above-mentioned embodiments, and other embodiments, which are not mentioned above, can be clearly understood by those skilled in the art from the following descriptions.

According to an aspect of the present disclosure, a display device includes: a display panel including a first display area and a second display area; a data correcting unit which is applied with n-bit input image data to generate (n-a)-bit corrected image data; a timing control unit which is applied with the (n-a)-bit corrected image data to generate (n-a)-bit output image data; and a data driving unit which is applied with the (n-a)-bit output image data to output a first data voltage to a first pixel disposed in the first display area and output a second data voltage to a second pixel which is disposed in the second display area and corresponds to the first pixel, in which a gray scale of the first pixel is the same as a gray scale of the second pixel or the gray scale of the first pixel and the gray scale of the second pixel are different by one gray scale, n is a natural number and a is a natural number which is smaller than n.

According to another aspect of the present disclosure, a driving method of a display device includes: receiving n-bit input image data; dividing the n-bit input image data to extract upper (n-a)-bit first corrected data and lower a-bit second corrected data to process input image data; determining an order of $2^a$ frames; determining a position where corrected image data is output; and converting the first corrected data based on the second corrected data, the frame signal, and the position signal to output the corrected image data, in which the corrected image data is generated by combining the first corrected data value and a data value obtained by adding 1 to the first corrected data value and n is a natural number and a is a natural number which is smaller than n.

Other detailed matters of the embodiments are included in the detailed description and the drawings.

According to the present disclosure, corrected image data which has a lower bit number than that of input image data is used to express the same color depth as a color depth which is expressed by the input image data so that the data amount processed by the timing control unit and the data driver is reduced. Therefore, the processing speed of the timing control unit and the data driver may be improved.

According to the present disclosure, corrected image data is converted so as to correspond to a change in an input image data value due to scene change of the image so that even when a moving image screen with frequent gray scale change is displayed, the image may be smoothly displayed using a corrected image data with a lower bit number.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIG. 7 is a table explaining an operation of a data output unit of a display device according to an exemplary embodiment of the present disclosure;

FIG. 9 is a table explaining another type of operation of a data output unit of a display device according to an exemplary embodiment of the present disclosure;

DETAILED DESCRIPTION

Figure 1:
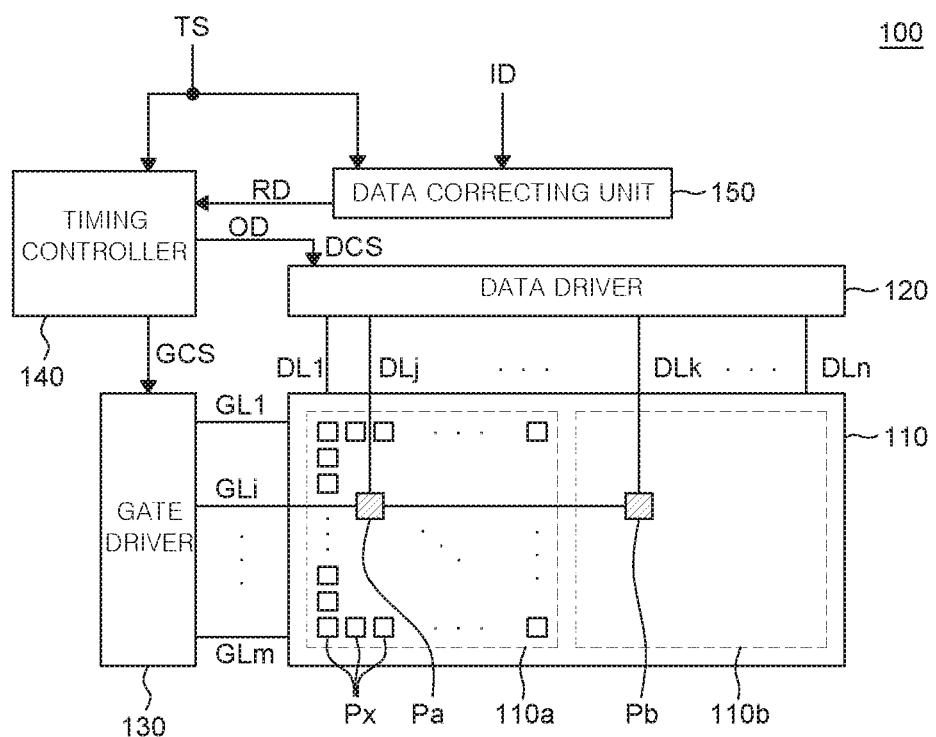
FIG. 1 is a schematic block diagram for explaining a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

The features of various embodiments of the present disclosure can be partially or entirely bonded to or combined with each other and can be interlocked and operated in technically various ways understood by those skilled in the art, and the embodiments can be carried out independently of or in association with each other.

Hereinafter, various exemplary embodiments of the present disclosure will be described in detail with reference to accompanying drawings.

FIG. 1 is a schematic block diagram for explaining a display device according to an exemplary embodiment of the present disclosure.

Referring to FIG. 1, a display device 100 includes a display panel 110, a data driver 120, a gate driver 130, a timing control unit 140, and a data correcting unit 150. Various features of the present disclosure are described using the term "unit," including the timing control unit 140 and the data correcting unit 150, as well as other features which will be described in further detail herein. It should be understood that such units may be implemented at least in part by electrical circuitry, including by one or more of integrated circuits, microprocessors, or the like.

The display panel 110 is configured such that a plurality of gate lines GL1 to GLm and a plurality of data lines DL intersect each other to be formed in a matrix on a substrate which uses glass or plastic. A plurality of pixels Px is defined at the intersections of the plurality of gate lines GL and the data lines DL.

Each pixel Px of the display panel 110 includes at least one thin film transistor. A gate electrode of the thin film transistor is connected to the gate line GL and a source electrode is connected to the data line DL.

In the case of a liquid crystal display device, a drain electrode is connected to a pixel electrode facing a common electrode to control a voltage which is applied to liquid crystal. By doing this, movement of the liquid crystal is controlled to implement a gray scale of the liquid crystal display device.

In the case of an organic electroluminescent display device, a voltage is applied to an organic layer disposed between the pixel electrode and the common electrode and electrons and holes which are discharged by the voltage to generate excitons. The excitons emit light to implement the gray scale of the organic electroluminescent display device.

The display panel 110 may include a plurality of display areas. That is, the display panel 110 includes a first display area 110a which is disposed at a left side of the display panel 110 to display an image to be output to a left eye of a viewer and a second display area 110b which is disposed at a right side of the display panel 110 to display an image to be output to a right eye of the viewer. Here, the image output to the first display area 110a and the image output to the second display area 110b are basically output based on the same original image. Further, the image output to the first display area 110a and the image output to the second display area 110b may be obtained by performing a slightly different correction process on the original image so that the viewer may feel the virtual reality close to an actual reality.

In order to effectively express the virtual reality, a refractive lens for distortion of an image may be further disposed between the first display area 110a and the left eye of the viewer and a refractive lens for distortion may be further disposed between the second display area 110b and the right eye of the viewer.

In FIG. 1, a single display type display device 100 in which the first display area 110a and the second display area 110b are disposed on one display panel 110 is illustrated. However, the present disclosure is not limited thereto and a dual display type display device including the display panel 110 which includes a first display panel including the first display area 110a and a second display panel which is separated from the first display panel and includes the second display area 110b may be implemented.

In the first display area 110a and the second display area 110b, a plurality of pixels Px may be disposed. The plurality of pixels Px is disposed in a row direction and a column direction in a matrix form. Here, since the image output to the first display area 110a and the image output to the second display area 110b need to correspond to each other, the display panel 110 includes a first pixel Pa disposed in the first display area 110a and a second pixel Pb which is disposed in the second display area 110b and corresponds to the first pixel Pa, for example, with the first pixel Pa being disposed at a position in the first display area 110a and the second pixel Pb being disposed at a position in the second display area 110b that corresponds with the position of the first pixel Pa in the first display area 110a. That is, the image output to the first display area 110a and the image output to the second display area 110b are basically output based on the same original image. Therefore, the same gray scale is output to the first pixel Pa and the second pixel Pb or a slightly different correction process may be performed on the same gray scale.

Here, the first pixel Pa and the second pixel Pb may include a plurality of sub pixels and each of the sub pixels may implement light of a specific color. For example, the plurality of sub pixels may be configured by a red sub pixel which implements red, a green sub pixel which implements green, and a blue sub pixel which implements blue, but is not limited thereto.

The plurality of pixels Px of the display panel 110 is connected to the gate lines GL1 to GLm and the data lines DL1 to DLn. For example, the first pixel Pa disposed in the first display area 110a is connected to an i-th gate line GLi and a j-th data line DLj and the second pixel Pb disposed in the second display area 110b is connected to the i-th gate line GLi and a k-th data line DLk. The plurality of pixels Px may be configured to operate based on a gate voltage transmitted from the gate lines GL1 to GLm and a data voltage transmitted from the data lines DL1 to DLn.

The timing control unit 140 supplies various control signals DCS and GCS and output image data OD to the data driver 120 and the gate driver 130 to control the data driver 120 and the gate driver 130.

The timing control unit 140 starts scanning in accordance with a timing implemented at each frame and converts the corrected image data RD received from the data correcting unit 150 in accordance with a data signal format which can be processed by the data driver 120 to output the output image data OD and controls the data driving at an appropriate time in accordance with the scanning.

More specifically, the timing control unit 140 receives various timing signals TS including a vertical synchronization signal Vsync, a horizontal synchronization signal Hsync, a data enable signal DE, and a data clock signal DCLK together with the corrected image signal RD from the external host system.

In order to control the data driver 120 and the gate driver 130, the timing control unit 140 receives the timing signal TS such as the vertical synchronization signal Vsync, the horizontal synchronization signal Hsync, the data enable signal DE, and the data clock signal DCLK and generates various control signals DCS and GCS. The timing control unit 140 outputs the various control signals DCS and GCS to the data driver 120 and the gate driver 130.

For example, in order to control the gate driver 130, the timing control unit 140 outputs various gate control signals GCS including a gate start pulse GSP, a gate shift clock GSC, and a gate output enable signal GOE.

Here, the gate start pulse controls an operation start timing of one or more gate circuits which configure the gate driving unit 130. The gate shift clock is a clock signal which is commonly input to one or more gate circuits and controls a shift timing of the scan signal (gate pulse). The gate output enable signal designates timing information of one or more gate circuits.

Further, in order to control the data driver 120, the timing control unit 140 outputs various data control signals DCS including a source start pulse SSP, a source sampling clock SSC, and a source output enable signal SOE.

Here, the source start pulse controls a data sampling start timing of one or more data circuits which configure the data driver 120. The source sampling clock is a clock signal which controls a sampling timing of data in each data circuit. The source output enable signal controls an output timing of the data driver 120.

The timing control unit 140 may be disposed on a control printed circuit board which is connected to a source printed circuit board to which the data driver 120 is bonded through a connecting medium such as a flexible flat cable (FFC) or a flexible printed circuit (FPC).

In the control printed circuit board, a power controller which supplies various voltages or currents to the display panel 110, the data driver 120, and the gate driver 130 or controls various voltages or currents to be supplied may be further disposed. The power controller may also be referred to as a power management integrated circuit (PMIC).

The source printed circuit board and the control printed circuit board described above may be configured by one printed circuit board.

The gate driver 130 sequentially supplies a gate voltage which is an on-voltage or an off-voltage to the gate lines GL1 to GLm in accordance with the control of the timing control unit 140.

According to a driving method, the gate driver 130 may be located only at one side of the display panel 110 or located at both sides if necessary.

The gate driver 130 may be connected to a bonding pad of the display panel 110 by means of a tape automated bonding (TAB) method or a chip on glass (COG) method. The gate driver may be implemented to be a gate in panel (GIP) type to be directly disposed in the display panel 110, or may be integrated to be disposed in the display panel 110, if necessary.

The gate driver 130 may include a shift register or a level shifter.

The data driver 120 converts the output image data OD received from the timing control unit 140 into an analog data voltage and outputs the analog data voltage to the data lines DL1 to DLn.

For example, the data driver 120 outputs a first data voltage to a first pixel Pa connected to the j-th data line DLj and outputs a second data voltage to a second pixel Pb connected to the k-th data line DLk.

The data driver 120 is connected to the bonding pad of the display panel 110 by a tape automated bonding method or a chip on glass method or may be directly disposed on the display panel 110. If necessary, the data driver 120 may be integrated to be disposed in the display panel 110.

Further, the data driver 120 may be implemented by a chip on film (COF) method. In this case, one end of the data driver 120 may be bonded to at least one source printed circuit board and the other end may be bonded to the display panel 110.

The data driver 120 may include a logic unit including various circuits such as a level shifter or a latch unit, a digital analog converter DAC, and an output buffer.

Specifically, as illustrated in FIG. 1, when the display device 100 is a single display type display device in which the first display area 110a and the second display area 110b are disposed on one display panel 110, the data voltage may be applied to all the data lines DL1 to DLn by one data driver 120. Further, as described above, when the display panel 110 is a dual display type which is divided into a first display panel including the first display area 110a and a second display panel including the second display area 110b, the data driver 120 is also divided into a first data driver which drives the first display panel 110 and a second data driver which drives the second display panel 110, but is not limited thereto.

Hereinafter, the data correcting unit 150 will be described in more detail with reference to FIG. 2.

Figure 2:
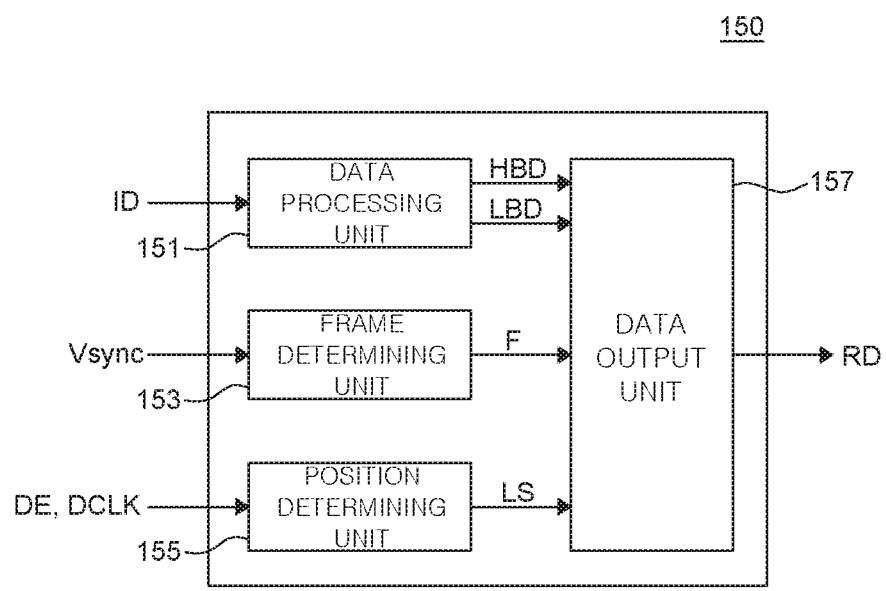
FIG. 2 is a schematic block diagram for explaining a data correcting unit of a display device according to an exemplary embodiment of the present disclosure.

FIG. 2 is a schematic block diagram of a data correcting unit of a display device according to an exemplary embodiment of the present disclosure;

The data correcting unit 150 receives n-bit input image data ID from the external host system. Thereafter, the data correcting unit 150 corrects the n-bit input image data ID which is output during one frame into n or lower bit corrected image data RD which is output during a plurality of frames. As illustrated in FIG. 2, the data correcting unit 150 includes a data processing unit 151, a frame determining unit 153, a position determining unit 155, and a data output unit 157.

Here, the input image data ID is high quality image data and includes information on an image having a high color depth. "Color depth" is expressiveness of color, resolution, or luminance expressiveness, or gray scale expressiveness. Since input image data ID for an image having excellent color depth includes information on higher color depth, the input image data has a large amount of information and a high bit number. Specifically, the input image data ID may be n-bit (n is a natural number of 1 or larger).

The corrected image data RD has a lower bit number than that of the input image data ID. For example, the corrected image data RD may be (n-a)-bit (a is a natural number of n or smaller). Since the corrected image data RD has a lower bit number than that of the input image data ID, a size of data may be reduced and an amount of data processed in the timing control unit 140 and the data driver 120 may be reduced. Therefore, the processing speed of the timing control unit 140 and the data driver 120 may be improved.

Figures 3A, 3B:
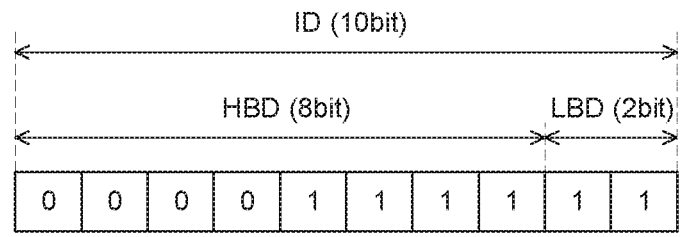
FIGS. 3A and 3B are a conceptual view and a table illustrating an input image data packet processed in a data processing unit of a display device according to an exemplary embodiment of the present disclosure.

FIGS. 3A and 3B are a conceptual view and a table illustrating an input image data packet processed in a data processing unit of a display device according to an exemplary embodiment of the present disclosure.

The data processing unit 151 divides n-bit input image data ID to extract first corrected data HBD and second corrected data LBD each having a reduced bit number as compared with the input image data ID.

That is, the data processing unit 151 divides the n-bit input image data ID into an upper (n-a)-bit first corrected data HBD and a lower a-bit second corrected data LBD to transmit (n-a)-bit first corrected data HBD and a-bit second corrected data LBD to the data output unit 157.

For example, as illustrated in FIG. 3A, when the bit number of the input image data ID is 10, the bit number of the first corrected data HBD is 8, and the bit number of the second corrected data LBD is 2, if a value of input image data ID corresponding to one frame is 0000111111, a value of the first corrected data HBD is 00001111 which is an upper 8-bit value and a value of the second corrected data LBD is 11 which is a lower 2-bit value.

In summary, the data processing unit divides 10-bit input image data ID which may express 1024 gray scales to extract 8-bit first corrected data HBD which expresses 256 gray scales and 2-bit second corrected data LBD which expresses a detail gray scale between gray scales expressed by the first corrected data HBD.

By expanding this, as illustrated in FIG. 3A, 0000111110 which is a 10-bit input image data ID value expressing 62 gray scales of 1024 gray scales is divided into 00001111 which is an 8-bit first corrected data HBD value expressing 15 gray scales of 256 gray scales and 10 which is a second corrected data LBD value. Further, 0000111111 which is a 10-bit input image data ID value expressing 63 gray scales of 1024 gray scales is divided into 00001111 which is an 8-bit first corrected data HBD value expressing 15 gray scales of 256 gray scales and 11 which is a second corrected data LBD value.

According to the above-mentioned method, the first corrected data HBD values of 0001000000 to 0001000011 which are a 10 bit input data value ID expressing 64 gray scales to 67 gray scales of 1024 gray scales are the same as 00010000 expressing 16 gray scales of 256 gray scales, but the second corrected data values LBD thereof are different to be 00, 01, 10, and 11.

Figure 4:
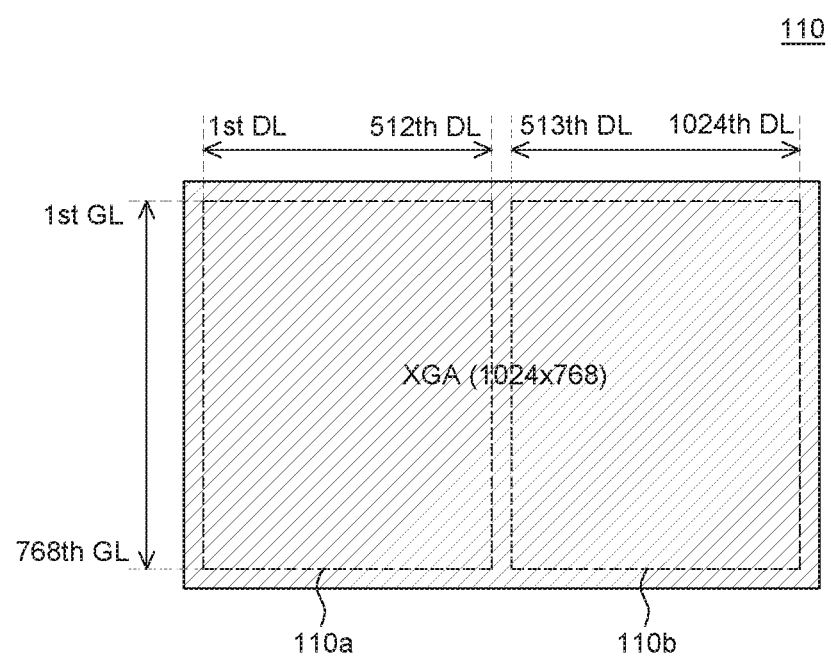
FIG. 4 is a schematic view for explaining a resolution of a display device according to an exemplary embodiment of the present disclosure.

FIG. 4 is a schematic view for explaining a resolution of a display device according to an exemplary embodiment of the present disclosure.

As illustrated in FIG. 4, for the convenience of description, hereinafter, it is assumed that the display panel 110 of the display device according to the present disclosure has an XGA resolution having 768 gate lines GL and 1024 data lines DL. Therefore, the first data line DL1 to a 512-th data line DL512 are disposed in the first display area 110a and a 513-th data line DL513 to a 1024-th data line DL1024 are disposed in the second display area 110b.

Figure 5:
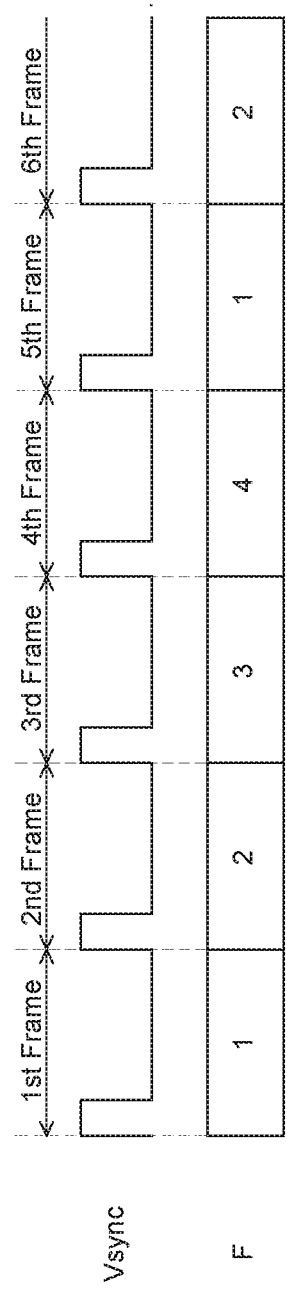
FIG. 5 is a timing chart for explaining an operation of a frame determining unit of a display device according to an exemplary embodiment of the present disclosure.

FIG. 5 is a timing chart for explaining an operation of a frame determining unit of a display device according to an exemplary embodiment of the present disclosure.

The data processing unit 151 counts the number of frames of input image data ID to generate a frame signal F representing an order of frames in which the corrected image data RD is output.

That is, the data processing unit measures a vertical synchronization signal Vsync applied from the external host system to count the number of frames of the input image data ID and group the frames with respect to the $2^a$ frames and number the grouped frames to generate a frame signal F corresponding to any one integer of 1 to $2^a$. In other words, the frame signal F is periodically repeated by an integer multiple of 1 to $2^a$ in the unit of $2^a$ frames.

Here, the vertical synchronization signal Vsync is a reference signal representing a start or an end of one frame in terms of time and also denoted by a frame pulse (FP) or a first line marker (FLM) depending on a system. Such a vertical synchronization signal Vsync is counted to count the number of frames.

For example, referring to FIG. 5, the number of frames of the input image data ID is counted by counting a rising time or a falling time of the vertical synchronization signal Vsync. Thereafter, when it is assumed that a is 2, the frame signal F corresponding to a first frame to a fourth frame is 1 to 4 and a frame signal F corresponding to a fifth frame is 1, and a frame signal F corresponding to a sixth frame is 2. That is, the frame signal F is periodically repeated in the unit of four frames.

Figure 6:
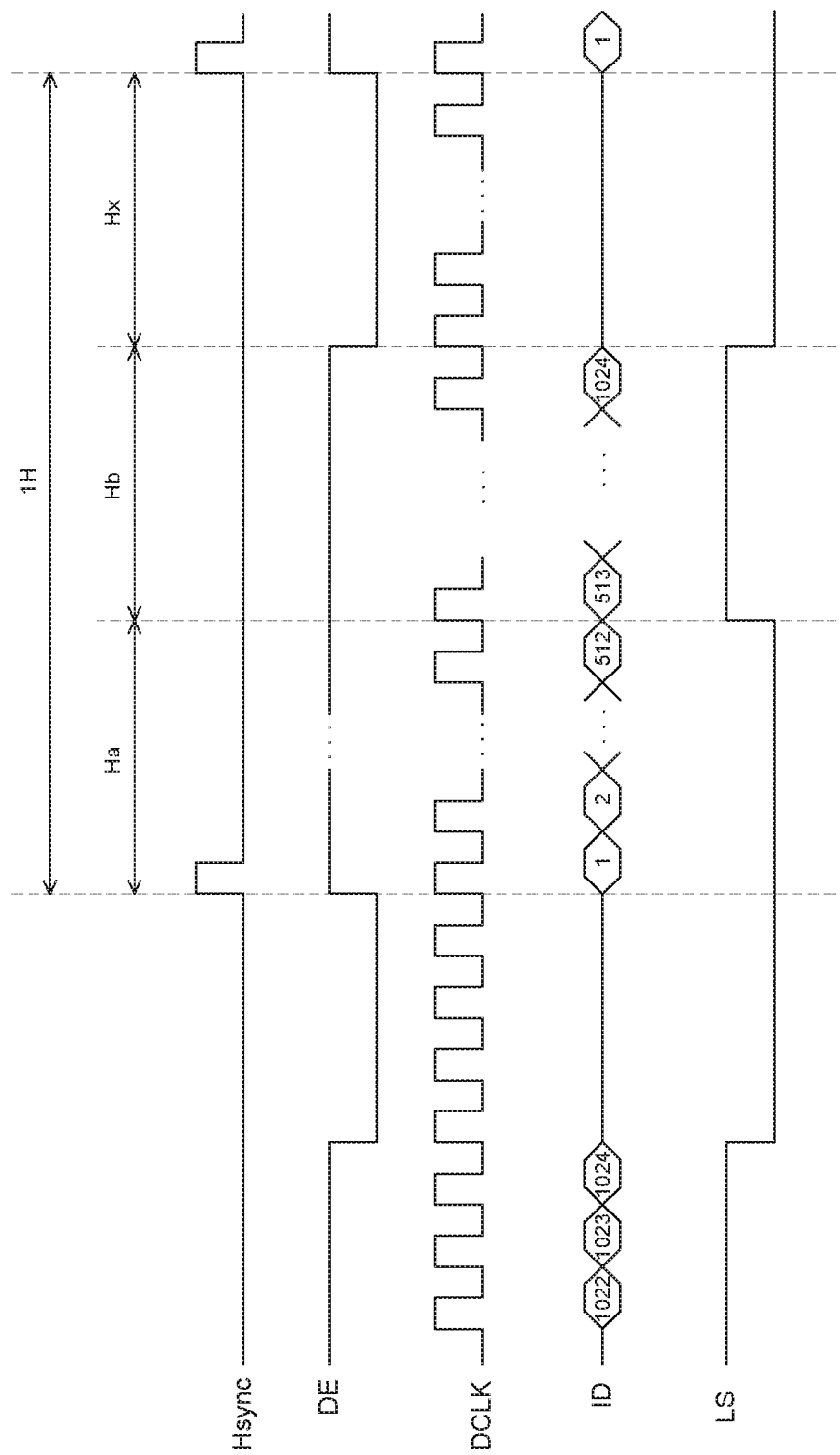
FIG. 6 is a timing chart for explaining an operation of a position determining unit of a display device according to an exemplary embodiment of the present disclosure.

FIG. 6 is a timing chart for explaining an operation of a position determining unit of a display device according to an exemplary embodiment of the present disclosure.

The position determining unit 155 generates a position signal LS determining a position where the corrected image data RD is output, based on the number of input image data ID during one horizontal period 1H.

That is, during one horizontal period 1H which is counted through the horizontal synchronization signal Hsync applied from the external host system, the number of data clock signals DCLK in an on-state of the data enable signal DE is counted. When the number of counted data clock signals DCLK is equal to or less than half of the number of data lines DL, a low level position signal LS is output such that the corrected image data RD is output to the first display area 110a corresponding to the left eye of the viewer. When the number of counted data clock signals DCLK exceeds half of the number of data lines DL, a high level position signal LS is output such that the corrected image data RD is output to the second display area 110b corresponding to the right eye of the viewer.

Here, the vertical synchronization signal Vsync is a reference signal representing a start or an end of the gate line GL in terms of time and also denoted by a line pulse (LP). The data enable signal DE is a signal representing a section in which actually effective image data is input during one horizontal period 1H and the data clock signal DCLK is a signal determining a timing when effective image data is output. Therefore, effective image data is transmitted to the display panel 110 in accordance with a rising time or a falling time of the data clock signal DCLK in the on-state of the data enable signal DE.

An operation of the position determining unit 155 with respect to a display panel 110 having an XGA resolution having 1024 data lines DL and 768 gate lines GL at 60 Hz will be described below with reference to FIG. 6.

One horizontal period 1H is defined in accordance with a rising time of the vertical synchronization signal Vsync. One horizontal period 1H of the display panel 110 is 1/(60 Hz×768)=00.021 ms. Only during a partial section of the one horizontal period 1H, the data enable signal DE is in an on-state, so that 1024 effective input image data ID is input during a section Ha+Hb in which the data enable signal DE is in an on-state. During a blank section Hx in which the data enable signal DE is in an off state, input image data ID is not input.

During a first data section Ha in which the number of counted data clock signals DCLK is equal to or less than 512 which is half of the number of data lines DL, in the section Ha+Hb in which the data enable signal DE is in an on state, the position signal LS is generated to be a low level. Therefore, the corrected image data RD may be output to the first display area 110a corresponding to the left eye of the viewer.

In contrast, during a second data section Hb in which the number of counted data clock signals DCLK exceeds 512 which is half of the number of data lines DL, in the section Ha+Hb in which the data enable signal DE is in an on state, the position signal LS is generated to be a high level. Therefore, the corrected image data RD may be output to the second display area 110b corresponding to the right eye of the viewer.

Therefore, when the position signal LS is in a high level, the corrected image data RD which is output to the first pixel Pa disposed in the first data area 110a is generated and when the position signal LS is in a low level, the corrected image data RD which is output to the second pixel Pb disposed in the second data area 110b is generated.

FIG. 7 is a table explaining an operation of a data output unit of a display device according to an exemplary embodiment of the present disclosure.

The data output unit 157 converts the first corrected data HBD based on the second corrected data LBD, the frame signal F, and the position signal LS to generate the corrected image data RD.

That is, the data output unit 157 determines a detail gray scale of the corrected image data RD from the second corrected data LBD. In order to express the detail gray scale, it is determined whether the corrected image data RD is output to the first display area 110a or the second display area 110b in accordance with the level of the position signal LS. Further, it is determined that the corrected image data RD is output to which frame among the grouped $2^a$ frames from the frame signal F.

In other words, in order to implement the detail gray scale of the corrected image data RD determined by the second corrected data LBD, both eye gray scale mixing is performed through the first display area 110a and the second display area 110b using the position signal LS. Simultaneously, a temporal gray scale mixing is performed within the grouped $2^a$ frames using the frame signal F.

Referring to FIG. 7, the data output unit 157 combines the first corrected data HBD value and a data value obtained by adding 1 to the first corrected data HBD value to generate the corrected image data RD, using a lookup table based on values of the second corrected data LBD, the frame signal F, and the position signal LS. Therefore, a difference between the gray scale of the first pixel Pa and the gray scale of the second pixel Pb is one gray scale.

For example, as illustrated in FIG. 7, it is assumed that the first corrected data HBD value expressing 256 gray scales is n and the bit number of the second corrected data LBD is 2.

In this case, when the second corrected data LBD value is 00, the first corrected data HBD value n is output to the first pixel Pa and the second pixel Pb during four frames so that an average corrected image data ARD value of the first pixel Pa and the second pixel Pb becomes n during four frames.

Next, when the second corrected data LBD value is 01, the first corrected data HBD value n is output to the first pixel Pa and a data value n+1 obtained by adding 1 to the first corrected data HBD value n is output to the second pixel Pb during the first frame and the second frame and the first corrected data HBD value n is output to both the first pixel Pa and the second pixel Pb during the third frame and the fourth frame. By doing this, the average corrected image data ARD value of the first pixel Pa and the second pixel Pb becomes n+0.25 during four frames.

Next, when the second corrected data LBD value is 10, the first corrected data HBD value n is output to the first pixel Pa and a data value n+1 obtained by adding 1 to the first corrected data HBD value n is output to the second pixel Pb during four frames so that an average corrected image data ARD value of the first pixel Pa and the second pixel Pb becomes n+0.5 during four frames.

Finally, when the second corrected data LBD value is 11, the first corrected data HBD value n is output to the first pixel Pa and a data value n+1 obtained by adding 1 to the first corrected data HBD value n is output to the second pixel Pb during the first frame and the second frame and a data value n+1 obtained by adding 1 to the first corrected data HBD value n is output to both the first pixel Pa and the second pixel Pb during the third frame and the fourth frame. By doing this, the average corrected image data ARD value of the first pixel Pa and the second pixel Pb becomes n+0.75 during four frames.

In summary, the data output unit 157 outputs the corrected image data RD such that the average of the corrected image data RD values becomes a sum of the first corrected data HBD value and the second corrected data LBD value*(1/(2^a)) during 2^a frames.

As described above, the data output unit 157 outputs the corrected image data RD by combining 8-bit first corrected data HBD during grouped four frames, so that the gray scale is subdivided to display an output image as if 10-bit image data is input. That is, the corrected image data RD having a-bit number which is lower than the bit number of the input image data ID may be used to express a color depth same as the color depth which will be expressed by the input image data ID. Therefore, the size of data is reduced and an amount of data processed by the timing control unit 140 and the data driver 120 may be reduced. Therefore, the processing speed of the timing control unit 140 and the data driver 120 may be improved.

Further, the bit number of the input image data ID is reduced to be a-bit number of the corrected image data RD so that the size of the timing control unit 140 and the data driver 120 which process the corrected image data RD is reduced. Therefore, the bezel size of the display panel 110 is reduced.

Until now, the operation of the display device according to the exemplary embodiment of the present disclosure has been described assuming that n is 10 and a is 2. Hereinafter, an operation of the display device according to the exemplary embodiment of the present disclosure will be described assuming that n is 10 and a is 3. A different part from the above description will be mainly described.

Figures 8A, 8B:
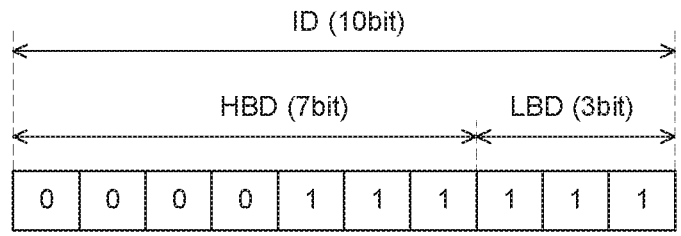
FIGS. 8A and 8B are a conceptual view and a table illustrating an input image data packet processed in a data processing unit of a display device according to an exemplary embodiment of the present disclosure.

FIGS. 8A and 8B are a conceptual view and a table illustrating an input image data packet processed in a data processing unit of a display device according to an exemplary embodiment of the present disclosure.

The data processing unit 151 divides n-bit input image data ID to extract first corrected data HBD and second corrected data LBD each having a reduced bit number as compared with the input image data ID.

For example, as illustrated in FIG. 8A, when the bit number of the input image data ID is 10, the bit number of the first corrected data HBD is 7, and the bit number of the second corrected data LBD is 3, if a value of input image data ID corresponding to one frame is 0000111111, a value of the first corrected data HBD is 0000111 which is an upper 7-bit value and a value of the second corrected data LBD is 111 which is a lower 3-bit value.

In summary, the data processing unit divides 10-bit input image data ID which may express 1024 gray scales to extract 7-bit first corrected data HBD which expresses 128 gray scales and 3-bit second corrected data LBD of 1024 which expresses a detail gray scale between grayscales which will be expressed by the first corrected data HBD.

By expanding this, as illustrated in FIG. 8B, 0000111110 which is a 10-bit input image data ID value expressing 62 gray scales of 1024 gray scales is divided into 0000111 which is a 7-bit first corrected data HBD value expressing 7 gray scales of 128 gray scales and 110 which is a second corrected data LBD value. Further, 0000111111 which is a 10-bit input image data ID value expressing 63 gray scales of 1024 gray scales is divided into 0000111 which is a 7-bit first corrected data HBD value expressing 7 gray scales of 128 gray scales and 111 which is a second corrected data LBD value.

According to the above-mentioned method, the first corrected data HBD values of 0001000000 to 0001000111 which are a 10-bit input data value ID expressing 64 gray scales to 73 gray scales of 1024 gray scales are the same as 0001000 expressing 8 gray scales of 128 gray scales, but the second corrected data values LBD thereof are different to be 000, 001, 010, 011, 100, 101, 110, and 111.

FIG. 9 is a table explaining an operation of a data output unit of a display device according to an exemplary embodiment of the present disclosure.

The data output unit 157 converts the first corrected data HBD based on the second corrected data LBD, the frame signal F, and the position signal LS to generate the corrected image data RD.

More specifically, the data output unit 157 combines the first corrected data HBD value and a data value obtained by adding 1 to the first corrected data HBD value to generate the corrected image data RD, using a lookup table based on values of the second corrected data LBD, the frame signal F, and the position signal LS. Therefore, a difference between the gray scale of the first pixel Pa and the gray scale of the second pixel Pb is one gray scale.

For example, as illustrated in FIG. 9, it is assumed that the first corrected data HBD value expressing 128 gray scales is n and the bit number of the second corrected data LBD is 3.

In this case, when the second corrected data LBD value is 000, the first corrected data HBD value n is output to both the first pixel Pa and the second pixel Pb during eight frames so that an average corrected image data ARD value of the first pixel Pa and the second pixel Pb becomes n during eight frames.

Next, when the second corrected data LBD value is 001, the first corrected data HBD value n is output to the first pixel Pa and a data value n+1 obtained by adding 1 to the first corrected data HBD value n is output to the second pixel Pb during arbitrary two frames among eight frames and the first corrected data HBD value n is output to both the first pixel Pa and the second pixel Pb during the remaining six frames. By doing this, the average corrected image data ARD value of the first pixel Pa and the second pixel Pb becomes n+0.125 during eight frames.

Next, when the second corrected data LBD value is 010, the first corrected data HBD value n is output to the first pixel Pa and a data value n+1 obtained by adding 1 to the first corrected data HBD value n is output to the second pixel Pb during arbitrary four frames among eight frames and the first corrected data HBD value n is output to both the first pixel Pa and the second pixel Pb during the remaining four frames. By doing this, the average corrected image data ARD value of the first pixel Pa and the second pixel Pb becomes n+0.25 during eight frames.

Next, when the second corrected data LBD value is 010, the first corrected data HBD value n is output to the first pixel Pa and a data value n+1 obtained by adding 1 to the first corrected data HBD value n is output to the second pixel Pb during arbitrary six frames among eight frames and the first corrected data HBD value n is output to both the first pixel Pa and the second pixel Pb during the remaining two frames. By doing this, the average corrected image data ARD value of the first pixel Pa and the second pixel Pb becomes n+0.375 during eight frames.

Next, when the second corrected data LBD value is 100, the first corrected data HBD value n is output to the first pixel Pa and a data value n+1 obtained by adding 1 to the first corrected data HBD value n is output to the second pixel Pb during eight frames so that an average corrected image data ARD value of the first pixel Pa and the second pixel Pb becomes n+0.5 during eight frames.

Next, when the second corrected data LBD value is 101, a data value n+1 obtained by adding 1 to the first corrected data HBD value n is output to both the first pixel Pa and the second pixel Pb during arbitrary two frames among eight frames and the first corrected data HBD value n is output to the first pixel Pa and the data value n+1 obtained by adding 1 to the first corrected data HBD value n is output to the second pixel Pb during the remaining six frames. By doing this, the average corrected image data ARD value of the first pixel Pa and the second pixel Pb becomes n+0.625 during eight frames.

Next, when the second corrected data LBD value is 110, a data value n+1 obtained by adding 1 to the first corrected data HBD value n is output to both the first pixel Pa and the second pixel Pb during arbitrary four frames among eight frames and the first corrected data HBD value n is output to the first pixel Pa and the data value n+1 obtained by adding 1 to the first corrected data HBD value n is output to the second pixel Pb during the remaining four frames. By doing this, the average corrected image data ARD value of the first pixel Pa and the second pixel Pb becomes n+0.75 during eight frames.

Next, when the second corrected data LBD value is 111, a data value n+1 obtained by adding 1 to the first corrected data HBD value n is output to both the first pixel Pa and the second pixel Pb during arbitrary two frames among eight frames, the first corrected data HBD value n is output to the first pixel Pa and data value n+1 obtained by adding 1 to the first corrected data HBD value n is output to the second pixel Pb during the remaining six frames. By doing this, the average corrected image data ARD value of the first pixel Pa and the second pixel Pb becomes n+0.875 during eight frames.

That is, the data output unit 157 outputs the corrected image data RD such that the average of the corrected image data RD values becomes a sum of the first corrected data HBD value and the second corrected data LBD value*(1/(2^a)) during 2^a frames. In the above description, the operation of the data output unit 157 has been described by assuming that a is 3, but the present disclosure is not limited thereto and a may be expanded to a natural number of n or smaller.

As described above, the data output unit 157 outputs the corrected image data RD by combining 7-bit first corrected data HBD during grouped eight frames, so that the gray scale is subdivided to display an output image as if 10-bit image data is input. That is, the corrected image data RD having a-bit number which is lower than the bit number of the input image data ID may be used to express a color depth same as the color depth which will be expressed by the input image data ID. Therefore, the size of data is reduced and an amount of data processed by the timing control unit 140 and the data driver 120 may be reduced. Therefore, the processing speed of the timing control unit 140 and the data driver 120 may be improved.

Further, the bit number of the input image data ID is reduced to be a-bit number of the corrected image data RD so that the size of the timing control unit 140 and the data driving unit 120 which process the corrected image data RD is reduced. Therefore, the bezel size of the display panel 110 is reduced.

Figure 10:
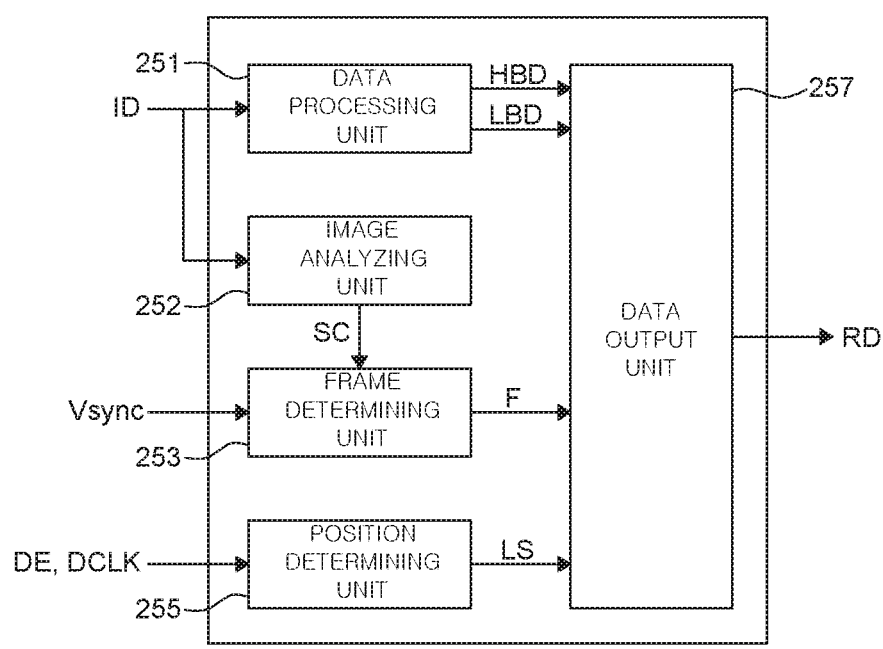
FIG. 10 is a schematic block diagram for explaining a data correcting unit of a display device according to another exemplary embodiment of the present disclosure.

FIG. 10 is a schematic block diagram for explaining a data correcting unit of a display device according to another exemplary embodiment of the present disclosure.

There is a problem in that the above-described display device according to one exemplary embodiment of the present disclosure can be applied only when the input image data ID express the same gray scale during 2^a frames. Therefore, it may be difficult to apply the embodiment of the present disclosure to the case in which a moving image with frequent gray scale changes is displayed due to a high scan rate of the display panel. Therefore, hereinafter, a display device according to another exemplary embodiment of the present disclosure for solving the above-mentioned problem will be described. The same contents as the display device according to the exemplary embodiment of the present disclosure will be omitted.

A data correcting unit 250 of a display device 200 according to another exemplary embodiment of the present disclosure receives n-bit input image data ID from an external host system. Thereafter, the data correcting unit 250 corrects the n-bit input image data ID which is output during one frame into n or lower bit corrected image data RD which is output during a plurality of frames. As illustrated in FIG. 10, the data correcting unit 250 of the display device 200 according to another exemplary embodiment of the present disclosure includes a data processing unit 251, an image analyzing unit 252, a frame determining unit 253, a position determining unit 255, and a data output unit 257. That is, the data correcting unit 250 of the display device 200 according to another exemplary embodiment of the present disclosure further includes the image analyzing unit 252 as compared with the data correcting unit 150 of the display device 100 according to one exemplary embodiment of the present disclosure.

Here, the image analyzing unit 252 analyzes the input image data ID of adjacent frames to determine whether there is a scene change of the image.

Specifically, the image analyzing unit 252 compares an input image data ID value of the entire pixels Px of a previous frame with an input image data ID value of the entire pixels Px of a current frame. When a difference between the input image data ID values is equal to or higher than a threshold data value, it is determined that there is a scene change of the image to output a high level image change signal SC to the frame determining unit 253.

Alternatively, a difference value between a histogram of the input image data ID of the previous frame and a histogram of the input image data ID of the current frame is calculated. When the difference value is higher than a threshold value, it is determined that there is a scene change of the image to output the high level image change signal SC to the frame determining unit 253.

However, the image scene change determination performed by the image analyzing unit 252 is not limited to the above described method, but may be performed by various image comparison methods.

Figure 11:
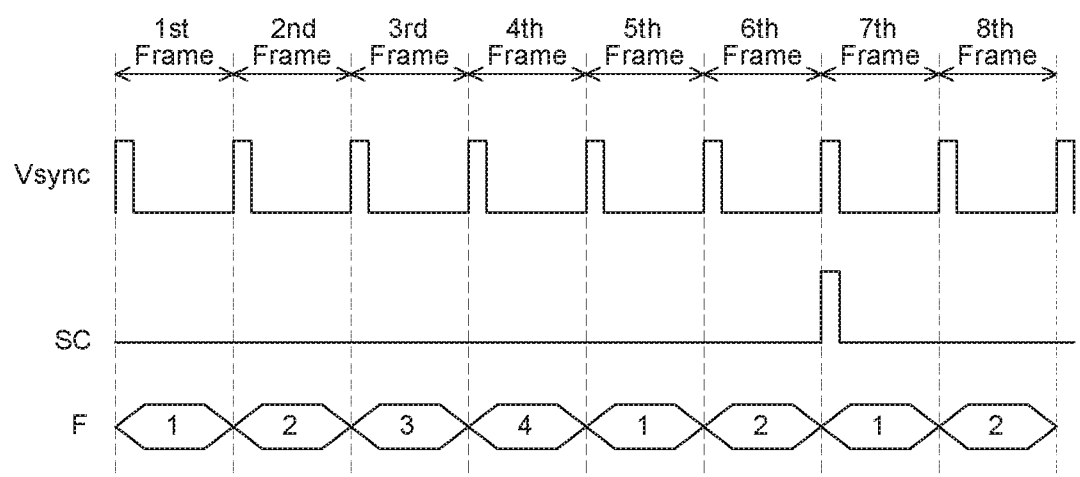
FIG. 11 is a timing chart for explaining an operation of a frame determining unit of a display device according to another exemplary embodiment of the present disclosure.

FIG. 11 is a timing chart for explaining an operation of a frame determining unit of a display device according to another exemplary embodiment of the present disclosure.

The frame determining unit 253 of the display device 200 according to another exemplary embodiment of the present disclosure counts the number of frames of the input image data ID to generate a frame signal F representing the order of frames in which the corrected image data RD is output. Additionally, when a high level image change signal SC is applied, the frame determining unit 253 is initialized to count the frame signal F from 1, again.

That is, the frame determining unit 253 measures a vertical synchronization signal Vsync applied from the external host system to count the number of frames of the input image data ID and group the frames by the 2^a frames and number the grouped frames to sequentially generate a frame signal F corresponding to any one integer of 1 to 2^a.

Further, a high level image change signal SC is applied, regardless of the output of the previous frame signal F, the frame determining unit 253 recounts the frame signal F from 1.

For example, referring to FIG. 11, the number of frames of the input image data ID is counted by counting a rising time or a falling time of the vertical synchronization signal Vsync. Thereafter, when it is assumed that a is 2, the frame signals F corresponding to a first frame to a fourth frame are 1 to 4 and a frame signal F corresponding to a fifth frame is 1, and a frame signal corresponding to a sixth frame is 2. That is, the frame signal F is periodically repeated in the unit of four frames. Further, when the high level image change signal SC is applied to the frame determining unit 253 at a timing when the seventh frame starts, the frame signal F is initialized to be 1 and a next frame signal F corresponding to an eighth frame is 2 again.

The data output unit 257 recognizes the initialized frame signal F to recognize the first corrected data HRD which is changed due to the scene change of the image and thus output changed corrected image data RD.

That is, the data output unit 257 combines the re-recognized first corrected data HBD value and a data value obtained by adding 1 to the re-recognized first corrected data HBD value to output the corrected image data RD, using a lookup table based on values of the second corrected data LBD, the frame signal F, and the position signal LS.

As described above, the frame signal F is initialized in accordance with the scene change of the image and the corrected image data RD is converted so as to correspond to the change of the input image data ID value due to the scene change of the image. Therefore, even though a moving image screen with frequent gray scale change is displayed, the display device of the present disclosure may smoothly display images.

Hereinafter, a driving method of a display device according to an exemplary embodiment of the present disclosure will be described.

Figure 12:
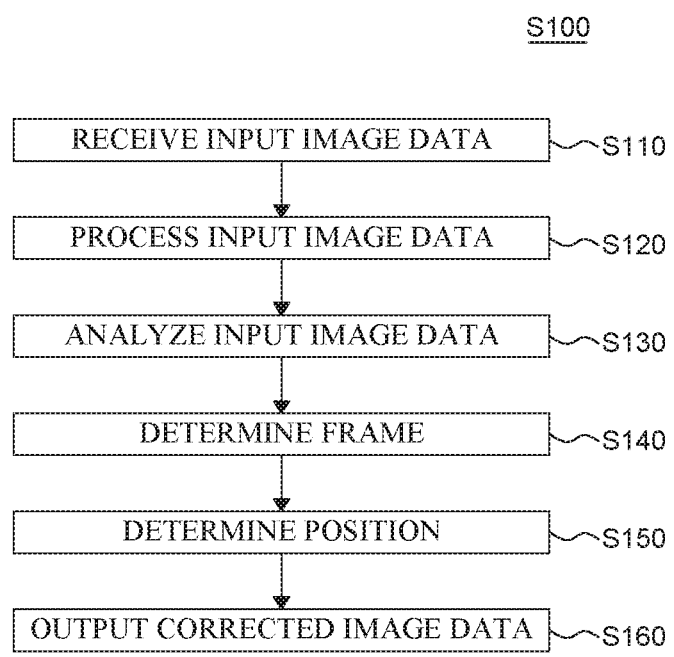
FIG. 12 is a flowchart for explaining a driving method of a display device according to one exemplary embodiment of the present disclosure.

FIG. 12 is a flowchart for explaining a driving method of a display device according to one exemplary embodiment of the present disclosure.

Referring to FIG. 12, a driving method S100 of a display device according to one exemplary embodiment of the present disclosure includes an input image data receiving step S110, an input image data processing step S120, an input image data analyzing step S130, a frame determining step S140, a position determining step S150, and a corrected image data output step S160.

During the input image data receiving step S110, in order to generate corrected image data RD, various timing signals TS including a vertical synchronization signal Vsync, a horizontal synchronization signal Hsync, a data enable signal DE, and a data clock signal DCLK are received together with the input image data ID from the external host system.

Here, the input image data ID is high quality image data and includes information on an image having a high color depth. "Color depth" is expressiveness of color, resolution, or luminance expressiveness, or gray scale expressiveness. Since input image data ID for an image having excellent color depth includes information on a higher color depth, the input image data has a large amount of information and a high bit number. Specifically, the input image data ID may be n-bit (n is a natural number of 1 or larger).

The corrected image data RD has a lower bit number than that of the input image data ID. For example, the corrected image data RD may be (n-a)-bit (a is a natural number of n or smaller). Since the corrected image data RD has a lower bit number than the input image data ID, the size of the data may be reduced so that the data processing speed may be improved.

Next, during the input image data processing step S120, n-bit input image data ID is divided to extract first corrected data HBD and second corrected data LBD each having a reduced bit number as compared with the input image data ID.

That is, during the input image data processing step S120, the n-bit input image data ID is divided into an upper (n-a)-bit first corrected data HBD and a lower a-bit second corrected data LBD to extract (n-a)-bit first corrected data HBD and a-bit second corrected data LBD.

Next, during the input image data analyzing step S130, input image data ID of an adjacent frame is analyzed to determine the scene change of the image.

Specifically, an input image data ID value of the entire pixels Px of a previous frame is compared with an input image data ID value of the entire pixels Px of a current frame. When a difference between the input image data ID values is equal to or higher than a threshold data value, it is determined that there is a scene change of the image to output a high level image change signal SC.

Alternatively, a difference value between a histogram of the input image data ID of the previous frame and a histogram of the input image data ID of the current frame is calculated. When the difference value is higher than a threshold value, it is determined that there is a scene change of the image to output the high level image change signal SC.

However, the image scene change determination performed in the input image data analyzing step S130 is not limited to the above described method, but may be performed by various image comparison methods.

Figure 13:
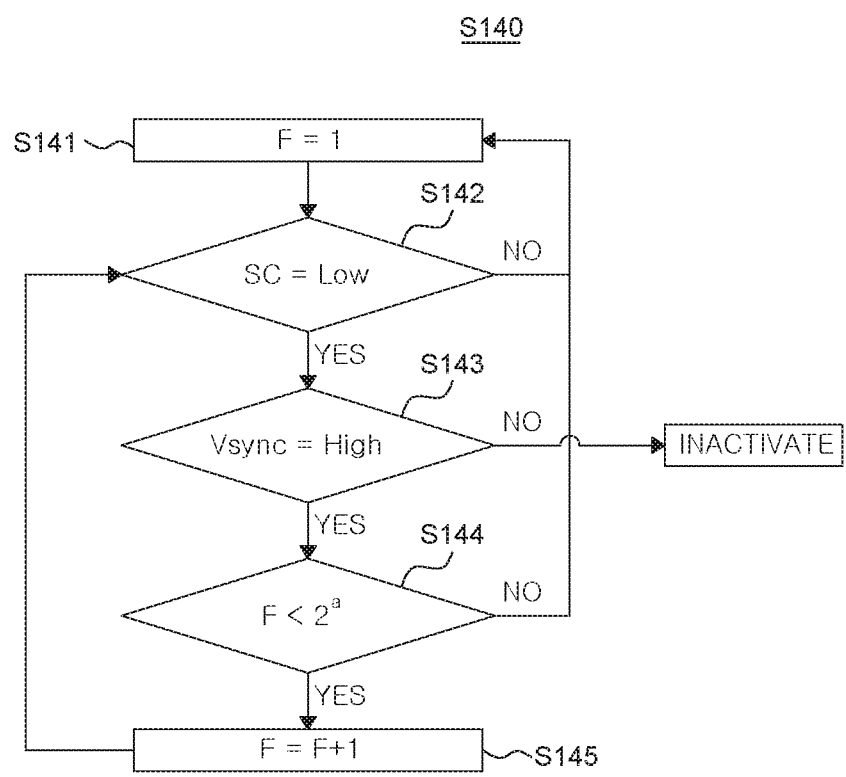
FIG. 13 is a flowchart for explaining an algorithm of a frame determining step of a driving method of a display device according to one exemplary embodiment of the present disclosure.

FIG. 13 is a flowchart for explaining an algorithm of a frame determining step of a driving method of a display device according to one exemplary embodiment of the present disclosure.

Next, during the frame determining step S140, the number of frames of input image data ID is counted to generate a frame signal F representing an order of frames in which the corrected image data RD is output.

That is, a vertical synchronization signal Vsync applied from the external host system is measured to count the number of frames of the input image data ID and group the frames by the $2^a$ frames and number the grouped frames to generate a frame signal F corresponding to any one integer of 1 to $2^a$. In other words, the frame signal F is periodically repeated by an integer multiple of 1 to $2^a$ in the unit of $2^a$ frames.

An algorithm of the frame determining step will be described below with reference to FIG. 13.

First, the frame signal F is initialized to 1. After step S141, when the low level image change signal SC is not applied, that is, the high level image change signal SC is applied, the frame signal F is initialized again to 1. (S142).

If the image change signal SC is a low level, the frame determining step S140 is activated only when the vertical synchronization signal Vsync is a high level. (S143)

When the frame signal F value is lower than $2^a$, 1 is added to the frame signal F value. When the frame signal F value is equal to or higher than $2^a$, the frame signal F value becomes 1 again to repeat the algorithm.

Next, during the position determining step S150, a position signal LS determining a position where the corrected image data RD is output is generated, based on the number of input image data ID during one horizontal period 1H.

Figure 14:
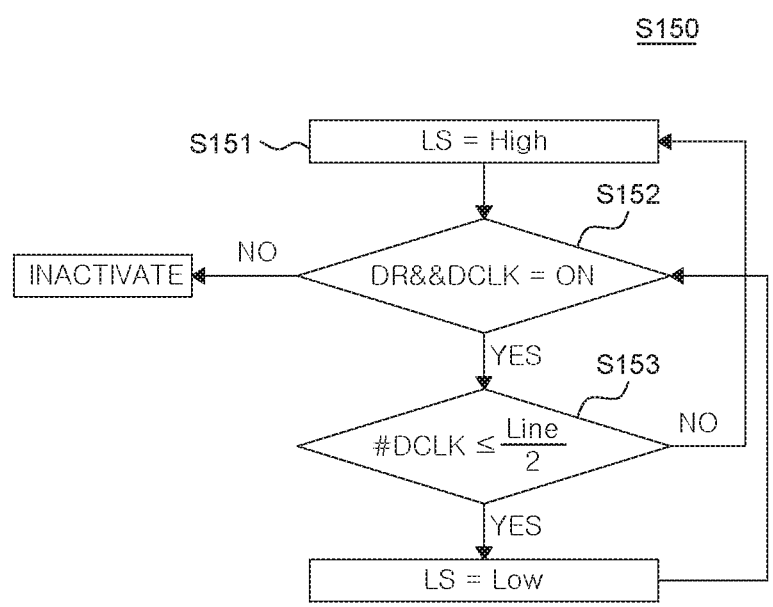
FIG. 14 is a flowchart for explaining an algorithm of a position determining step of a driving method of a display device according to one exemplary embodiment of the present disclosure.

FIG. 14 is a flowchart for explaining an algorithm of a position determining step of a driving method of a display device according to one exemplary embodiment of the present disclosure.

An algorithm of the position determining step S150 will be described below with reference to FIG. 14.

First, the position signal LS is initialized to 0 at a starting time of one horizontal period 1H. (S151). During the horizontal period 1H, the position determining step is activated only in the on-state of the data enable signal DE (S152).

Thereafter, when the data enable signal DE is an on state, if the number of counted data clock signals DCLK is equal to or smaller than half of the number of data lines DL, the position signal is output to be a low level. When the number of counted data clock signals DCLK exceeds the half of the number of data lines DL, the position signal is output to be a high level (S153).

Next, during the corrected image data output step S160, the first corrected data HBD is converted based on the second corrected data LBD, the frame signal F, and the position signal LS to generate the corrected image data RD.

That is, detail gray scale of the corrected image data RD is determined from the second corrected data LBD. In order to express the detail gray scale, it is determined whether the corrected image data RD is output to the first display area 110a or the second display area 110b in accordance with the level of the position signal LS. Further, it is determined that the corrected image data RD is output to which frame among the grouped $2^a$ frames from the frame signal F.

In other words, in order to implement the detail gray scale of the corrected image data RD determined by the second corrected data LBD, both eye gray scale mixing is performed through the first display area 110a and the second display area 110b using the position signal LS. Simultaneously, a temporal gray scale mixing is performed within the grouped $2^a$ frames using the frame signal F.

Referring to FIG. 7, during the corrected image data output step S160, the first corrected data HBD value and a data value obtained by adding 1 to the first corrected data HBD value are combined to generate the corrected image data RD, using a lookup table based on values of the second corrected data LBD, the frame signal F, and the position signal LS.

For example, as illustrated in FIG. 7, it is assumed that the first corrected data HBD value expressing 256 gray scales is n and the bit number of the second corrected data LBD is 2.

In this case, when the second corrected data LBD value is 00, the first corrected data HBD value n is output to the first pixel Pa and the second pixel Pb during four frames so that an average corrected image data ARD value of the first pixel Pa and the second pixel Pb becomes n during four frames.

Next, when the second corrected data LBD value is 01, the first corrected data HBD value n is output to the first pixel Pa and a data value n+1 obtained by adding 1 to the first corrected data HBD value n is output to the second pixel Pb during the first frame and the second frame and the first corrected data HBD value n is output to both the first pixel Pa and the second pixel Pb during the third frame and the fourth frame. By doing this, the average corrected image data ARD value of the first pixel Pa and the second pixel Pb becomes n+0.25 during four frames.

Next, when the second corrected data LBD value is 10, the first corrected data HBD value n is output to the first pixel Pa and a data value n+1 obtained by adding 1 to the first corrected data HBD value n is output to the second pixel Pb during four frames so that an average corrected image data ARD value of the first pixel Pa and the second pixel Pb becomes n+0.5 during four frames.

Last, when the second corrected data LBD value is 11, the first corrected data HBD value n is output to the first pixel Pa and a data value n+1 obtained by adding 1 to the first corrected data HBD value n is output to the second pixel Pb during the first frame and the second frame and the data value n+1 obtained by adding 1 to the first corrected data HBD value n is output to both the first pixel Pa and the second pixel Pb during the third frame and the fourth frame. By doing this, the average corrected image data ARD value of the first pixel Pa and the second pixel Pb becomes n+0.75 during four frames.

In summary, during the corrected data output step S160, the corrected image data RD is output such that the average of the corrected image data RD values becomes a sum of the first corrected data HBD value and the second corrected data LBD value*$(1/(2^a))$ during $2^a$ frames.

As described above, during the corrected image data output step S160, during grouped four frames, 8-bit first corrected data HBD is combined to output the corrected image data RD, so that the gray scale is subdivided to display an output image as if 10-bit image data is input. That is, the corrected image data RD having a-bit number which is lower than the bit number of the input image data ID may be used to express a color depth same as the color depth which will be expressed by the input image data ID. Therefore, the size of data is reduced so that the data processing speed of the display device may be improved.

Further, during the corrected image data output step S160, the initialized frame signal F is recognized to recognize the first corrected data HBD which is changed due to the scent change of the image and thus output changed corrected image data RD.

That is, the data output unit 257 combines the first corrected data HBD value and a data value obtained by adding 1 to the first corrected data HBD value to output the corrected image data RD, using a lookup table based on values of the second corrected data LBD, the frame signal F, and the position signal LS.

As described above, the frame signal F is initialized in accordance with the scene change of the image and the corrected image data RD is converted so as to correspond to the change of the input image data ID value due to the scene change of the image. Therefore, even though a moving image screen with frequent gray scale change is displayed, the display device of the present disclosure may smoothly display images.

The exemplary embodiments of the present disclosure can also be described as follows:

According to an aspect of the present disclosure, a display device includes: a display panel including a first display area and a second display area; a data correcting unit which is applied with n-bit input image data to generate (n-a)-bit corrected image data; a timing control unit which is applied with the (n-a)-bit corrected image data to generate (n-a)-bit output image data; and a data driving unit which is applied with the (n-a)-bit output image data to output a first data voltage to a first pixel disposed in the first display area and output a second data voltage to a second pixel which is disposed in the second display area and corresponds to the first pixel, in which a gray scale of the first pixel is the same as a gray scale of the second pixel or the gray scale of the first pixel and the gray scale of the second pixel are different by one gray scale, n is a natural number and a is a natural number which is smaller than n.

According to another aspect of the present disclosure, the data correcting unit may include: a data processing unit which divides the n-bit input image data to extract upper (n-a)-bit first corrected data and lower a-bit second corrected data; a frame determining unit which generates a frame signal representing an order of $2^a$ frames; a position determining unit which generates a position signal determining a position where the (n-a)-bit corrected image data is output; and a data output unit which converts the first corrected data based on the second corrected data, the frame signal, and the position signal to output the corrected image data to the timing control unit.

According to still another aspect of the present disclosure, the corrected image data may be obtained by combining the first corrected data value and a data value obtained by adding 1 to the first corrected data value.

According to still another aspect of the present disclosure, the data output unit may output the corrected image data such that an average of the corrected image data values is a sum of the first corrected data value and the second corrected data value*$(1/(2^a))$, during the $2^a$ frames.

According to still another aspect of the present disclosure, the frame signal may be any one integer of 1 to $2^a$.

According to still another aspect of the present disclosure, when the position signal is a low level, the corrected image data to be output to the first pixel may be generated and when the position signal is a high level, the corrected image data to be output to the second pixel may be generated.

According to still another aspect of the present disclosure, the data correcting unit may further include: an image analyzing unit which outputs a high level image change signal to the frame determining unit when the difference between the input image data value of a previous frame and the input image data value of a current frame is equal to or higher than a threshold data value.

According to still another aspect of the present disclosure, when the high level image change signal is applied, the frame determining unit may initialize the frame signal.

According to still another aspect of the present disclosure, when the frame signal is initialized, the data output unit may re-recognize the first corrected data value and combine the re-recognized first corrected data value and a data value obtained by adding 1 to the re-recognized first corrected data value to output corrected image data.

According to still another aspect of the present disclosure, n may be 10 and a may be 2 or 3.

According to still another aspect of the present disclosure, in the first display area, an image output to a left eye of a viewer may be displayed and in the second display area, an image output to a right eye of the viewer may be displayed.

According to another aspect of the present disclosure, a driving method of a display device includes: receiving n-bit input image data; dividing the n-bit input image data to extract upper (n-a)-bit first corrected data and lower a-bit second corrected data to process input image data; determining an order of $2^a$ frames; determining a position where corrected image data is output; and converting the first corrected data based on the second corrected data, the frame signal, and the position signal to output the corrected image data, in which the corrected image data may be generated by combining the first corrected data value and a data value obtained by adding 1 to the first corrected data value and n may be a natural number and a may be a natural number which is smaller than n.

According to another aspect of the present disclosure, an average of the corrected image data values may be a sum of the first corrected data value and the second corrected data value*$(1/(2^a))$, during the $2^a$ frames.

According to still another aspect of the present disclosure, the method may further include: before the determining of an order of frames, analyzing input image data to detect that a difference between an input image data value of a previous frame and an input image data value of a current frame is equal to or larger than a threshold data value.

According to still another aspect of the present disclosure, during the analyzing of input image data, when the difference between the input image data values is equal to or higher than a threshold data value, the determining of an order of frames may be initialized.

According to still another aspect of the present disclosure, during the outputting of corrected image data, when the frame signal is initialized, the first corrected data value may be re-recognized and the re-recognized first corrected data value and a data value obtained by adding 1 to the re-recognized first corrected data value may be combined to output corrected image data.

According to still another aspect of the present disclosure, n may be 10 and a may be 2 or 3.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
    a display panel including a first display area and a second display area;
    a data correcting unit which receives n-bit input image data and generates (n-a)-bit corrected image data;
    a timing control unit which receives the (n-a)-bit corrected image data and generates (n-a)-bit output image data; and
    a data driver which receives the (n-a)-bit output image data and outputs a first data voltage to a first pixel disposed in the first display area and outputs a second data voltage to a second pixel which is disposed in the second display area at a position that corresponds to a position of the first pixel in the first display area,
    wherein a gray scale of the first pixel and a gray scale of the second pixel are the same or are different by one gray scale, n is a natural number and a is a natural number which is smaller than n,
    wherein the data correcting unit includes:
        a data processing unit which divides the n-bit input image data and extracts upper (n-a)-bit first corrected data and lower a-bit second corrected data;
        a frame determining unit which generates a frame signal representing an order of $2^a$ frames;
        a position determining unit which generates a position signal determining a position where the (n-a)-bit corrected image data is output; and
        a data output unit which converts the first corrected data based on the second corrected data, the frame signal, and the position signal, and outputs the corrected image data to the timing control unit, and
    wherein the data output unit performs both eye gray scale mixing through the first display area and the second display area using the position signal and performs a temporal gray scale mixing within the $2^a$ frames using the frame signal.

2. The display device according to claim 1, wherein the corrected image data is obtained by combining the first corrected data and a data obtained by adding 1 to the first corrected data.

3. The display device according to claim 2, wherein an average of the corrected image data is a sum of the first corrected data and the second corrected data*$(1/(2^a))$, during the $2^a$ frames.

4. The display device according to claim 1, wherein the frame signal is any integer from 1 to $2^a$.

5. The display device according to claim 1, wherein when the position signal is a low level, the corrected image data to be output to the first pixel is generated and when the position signal is a high level, the corrected image data to be output to the second pixel is generated.

6. The display device according to claim 1, wherein the data correcting unit further includes: an image analyzing unit which outputs a high level image change signal to the frame determining unit when a difference between an input image data of a previous frame and an input image data of a current frame is equal to or higher than a threshold data.

7. The display device according to claim 6, wherein when the high level image change signal is applied, the frame determining unit initializes the frame signal.

8. The display device according to claim 7, wherein when the frame signal is initialized, the data output unit re-recognizes the first corrected data and combines the re-recognized first corrected data and a data obtained by adding 1 to the re-recognized first corrected data to output corrected image data.

9. The display device according to claim 1, wherein n is 10 and a is 2 or 3.

10. The display device according to claim 1, wherein in the first display area, an image output to a left eye of a viewer is displayed and in the second display area, an image output to a right eye of the viewer is displayed.

11. A driving method of a display device including a first display area and a second display area, comprising:
    receiving n-bit input image data;
    dividing the n-bit input image data to extract upper (n-a)-bit first corrected data and lower a-bit second corrected data;
    determining an order of $2^a$ frames;
    determining a position where corrected image data is to be output; and
    converting the first corrected data based on the second corrected data, a frame signal, and a position signal, and outputting the corrected image data,
    wherein the corrected image data is generated by combining the first corrected data and a data obtained by adding 1 to the first corrected data and n is a natural number and a is a natural number which is smaller than n, and
    wherein both eye gray scale mixing is performed through the first display area and the second display area using the position signal and a temporal gray scale mixing is performed within the $2^a$ frames using the frame signal during the converting the first corrected data.

12. The driving method according to claim 11, wherein an average of the corrected image data is a sum of the first corrected data and the second corrected data*$(1/(2^a))$, during the $2^a$ frames.

13. The driving method according to claim 11, further comprising:
    prior to the determining an order of frames, analyzing the input image data to detect that a difference between an input image data of a previous frame and an input image data of a current frame is equal to or larger than a threshold data.

14. The driving method according to claim 13, wherein during the analyzing of the input image data, when the difference between the input image data is equal to or higher than a threshold data, the determining of an order of frames is initialized.

15. The driving method according to claim 14, wherein during the outputting of corrected image data, when the frame signal is initialized, the first corrected data is re-recognized and the re-recognized first corrected data and a data obtained by adding 1 to the re-recognized first corrected data are combined to output corrected image data.

16. The driving method according to claim 11, wherein n is 10 and a is 2 or 3.

* * * * *